United States Patent
Rudkin et al.

(10) Patent No.: US 8,947,071 B2
(45) Date of Patent: Feb. 3, 2015

(54) NOISE REDUCTION SYSTEM AND METHOD

(75) Inventors: Mark Rudkin, Farnham (GB); Anthony Palmer, Alton (GB)

(73) Assignee: Weston Aerospace Limited, Farnborough, Hampshire (GB)

( * ) Notice: Subject to any disclaimer, the term of this patent is extended or adjusted under 35 U.S.C. 154(b) by 303 days.

(21) Appl. No.: 13/410,377

(22) Filed: Mar. 2, 2012

(65) Prior Publication Data
US 2013/0063127 A1   Mar. 14, 2013

(30) Foreign Application Priority Data

Mar. 3, 2011 (GB) .................... 1103680.3

(51) Int. Cl.
*G01R 23/02* (2006.01)
*G01R 23/10* (2006.01)
*G01L 9/12* (2006.01)

(52) U.S. Cl.
CPC .. *G01R 23/10* (2013.01); *G01L 9/12* (2013.01)
USPC ....................................... 324/76.39

(58) Field of Classification Search
CPC ........... G01R 23/10; G01R 9/12; G01R 23/02
See application file for complete search history.

(56) References Cited

U.S. PATENT DOCUMENTS

| | | | |
|---|---|---|---|
| 5,764,045 A | 6/1998 | Hayashi | |
| 7,747,222 B2 * | 6/2010 | Nallapureddy et al. | ... 324/76.11 |
| 7,839,153 B2 * | 11/2010 | Joy et al. | ........................ 324/633 |
| 2004/0075425 A1 | 4/2004 | Horio et al. | |
| 2004/0100245 A1 | 5/2004 | Oishi et al. | |
| 2007/0135057 A1 * | 6/2007 | Nallapureddy et al. | ........ 342/52 |
| 2010/0264902 A1 * | 10/2010 | Nallapureddy et al. | ... 324/76.24 |

FOREIGN PATENT DOCUMENTS

| | | |
|---|---|---|
| EP | 1746398 A1 | 1/2007 |
| GB | 2413386 A | 10/2005 |
| JP | 2008128762 A | 6/2008 |

OTHER PUBLICATIONS

Search Report dated May 11, 2011 for related Application No. GB1103680.3, 2 pgs.
Search Report dated Jun. 18, 2012 for related application No. EP12157683, 4 pgs.

* cited by examiner

*Primary Examiner* — Jermele M Hollington
(74) *Attorney, Agent, or Firm* — Fredrikson & Byron, P.A.

(57) ABSTRACT

A system and method for measuring frequency which reduces the impact of noise. The system and method includes the steps of sampling a signal train over a first signal portion of the signal train, determining a first average period for the first signal portion (t1) of the signal train, sampling the signal train over a second signal portion (t2) of the signal train, wherein, the second portion of the signal train overlaps with the first signal portion, determining a second average period for the second signal portion (t2) of the output signal train, and then determining the average of the determined average periods.

15 Claims, 5 Drawing Sheets

Example of pressure noise versus update rate for a vibrating cylinder pressure sensor (PRIOR ART)

NOISE REDUCTION SYSTEM AND METHOD

Related Applications

This application claims priority to British Patent Application No. 1103680.3 filed Mar. 3, 2011, the teachings of which are incorporated herein by reference.

FIELD OF THE INVENTION

The present invention is concerned with a system and method for sampling a signal train comprising a series of signal pulses and determining the frequency or period of the signal train, Embodiments of the invention are particularly useful for determining the frequency of a signal train having a frequency which is dependent on an input, or measured parameter. Particular embodiments of the subject invention arc concerned with measuring the output frequency of vibrating element sensors in such a way as to reduce the effect of noise on determinations of the value of the parameter measured by the subject vibrating element sensors.

BACKGROUND OF THE INVENTION

Vibrating element sensors may be used to measure pressure, density, force, viscosity and temperature. An example of such a sensor is described in GB 2,413,386. Examples are also the Weston 7881 pressure sensor and Weston 7825 fuel densitometer both manufactured by Weston Aerospace limited. Embodiments of the invention could also be used with Doppler radar where the frequency is proportional to the velocity of an object.

Vibrating element sensors, which include vibrating cylinder pressure and/or density sensors, provide an output frequency that is dependent on the measured parameter (e.g. pressure in a pressure sensor). The remainder of this application will refer to the measurement of pressure; however the same techniques would apply equally to the measurement of any other parameter using a vibrating element sensor, or any other sensor having an output signal with a frequency dependent on an input or measured parameter (for example, Doppler radar).

The sensor's output frequency must be determined or measured accurately, with low noise and sufficient resolution to meet the sensor's performance requirements The frequency, or period, of the sensor's output signal is measured against an accurate high frequency reference clock. In the example shown in FIG. 1 the reference clock, with frequency Fr, is counted between two falling edges 1 of the sensor's output signal 2.

The period T of the sensor signal in seconds is then given by:

$$T = \frac{Nc}{Fr \cdot Ns}, \tag{1}$$

where Fr is the reference clock frequency in Hz, Nc is the number of clock cycles and Ns is the number of sensor signal pulse cycles.

The resolution of the measured period is determined by the number of reference clock cycles in the measurement period. The resolution can be improved by increasing the frequency of the reference clock Fr, counting over a greater number of sensor cycles Nc (hence increasing the length of the measurement period), or a combination of both.

It is important to differentiate between genuine pressure variations and unwanted noise which does not relate to pressure changes. It is desirable to be able to measure the former but the latter should be minimised. For ease of understanding, the following discussion and explanation assumes the sensor input pressure is constant so that any noise referred to is unwanted and emanates either from within the sensor itself or as a result of external interference.

Noise on the sensor's output manifests itself as jitter on the edges of the measured signal pulses. The signal pulse edges 1 are shifted from their nominal 'true' position 3 by a randomly varying time. FIG. 2 shows the effect this has on the period measurement.

The measured time between the start and stop sensor edges 1 is in error by $\Delta t1+\Delta t2$.

Assuming that this jitter error on each edge ($\Delta tn$) has a normal (Gaussian) distribution, it can be expressed as an error with standard deviation e. As this appears on both the start and stop edges the error in the measured time is given by:

$$E=\sqrt{e^2+e^2} \tag{2}$$

where E is the standard deviation of the error in the measured time between the start and stop edges.

The 'root sum of squares' assumption of equation (2) only holds true if the errors in the start and stop edges are truly independent and there is no correlation between them. As explained later, this hypothesis can be tested by making real measurements.

If the pressure is constant and the noise on each of the edges is independent, then the jitter time on the measurement between any two edges is given by E. If the time measurement is made over Ns sensor cycles, the time error Ep in the measurement of a single sensor cycle period (i.e. the period between consecutive signal pulses) is given by:

$$Ep = \frac{E}{Ns} \tag{3}$$

The total measurement time t between the start and stop edges of a sampling period is given by:

$$t=Ns.P \tag{4}$$

where P is the period of a single sensor cycle.

Rearranging for Ns and substituting in the previous equation gives:

$$Ep = \frac{E \cdot P}{t} \tag{5}$$

If the sensor is making repeated measurements that are t seconds apart then the sampling update frequency F is given by 1/t. So the above equation for the time error Ep can by written as:

$$Ep=E.P.F \tag{6}$$

So if the noise on an edge is truly independent of the noise on other edges, it should be found that the jitter error, and hence the pressure noise, is proportional to the update rate of the measurement.

FIG. 3 shows an example of noise measurements made on a vibrating cylinder sensor at different update rates whilst measuring a constant pressure.

This shows a strong linear relationship between measurement noise and update rate, validating the hypothesis that the noise on a sensor output edge is independent of the noise on other sensor output edges.

Using the frequency measurement technique described above the known way of reducing the effect of noise has been to increase the sampling or measurement time and hence decrease the update rate. In some cases, where a fast update rate is not required, this is acceptable. However, in other cases, where for example the sensor forms part of a control loop, both a fast update rate and low noise are required.

SUMMARY OF EMBODIMENTS OF THE INVENTION

Preferred embodiments of the present invention aim to reduce the effect of noise while avoiding the need in the prior art to reduce the update rate (or response time), or to at least provide an alternative method and system for noise reduction.

The present invention provides a method and system set out in claims 1 and 8 to which reference should now be made. Preferred features of embodiments of the invention are set out in the dependent claims.

The inventors of the subject application have realised that the jitter noise on the edge of a sensed signal pulse is independent of the noise on other sensed signal pulses, and that the fact that the jitter noise on a sensor edge is independent of the noise on any other edge opens up the possibility of alternative sampling methods to reduce noise without significantly increasing the overall measurement time. Embodiments of the invention are particularly useful where one is measuring signal frequency when the received signal is very noisy. Examples of noisy frequency signals include Doppler radar and vibrating element sensors.

FIG. 4 shows two time measurements t1 and t2 each with a jitter or noise standard deviation of E and both measured over Ns sensor cycles. Although they are overlapping, the noise on the samples is independent because they do not share any edges. If the samples are averaged, the standard deviation E" of the noise on the result is:

$$E' = \frac{\sqrt{E^2 + E^2}}{2} = \frac{E}{\sqrt{2}} \tag{7}$$

If the samples had been end to end then the noise would have been reduced to E/2. Although this overlapping method does not give such a large noise reduction, the advantage is that the measurement time is only increased by one sensor cycle, rather than doubling the measurement time if the samples had been end to end.

In the general case, if there are n overlapping samples then the standard deviation of noise E" becomes:

$$E' = \frac{E}{\sqrt{n}} \tag{8}$$

So if n=4, the noise is halved with an increase in measurement time of only 4 sensor cycles.

The method shown in FIG. 4, where each overlapping sample is offset by just one sensor cycle, is efficient but may be difficult to implement in practice. Collecting timing data at single sensor cycle intervals requires fast processing times that may be unachievable in some instances. Alternatively the samples can be offset by more than one sensor cycle to increase the available time for processing. This does not affect the level of noise reduction achieved, but increases the length of the measurement time. FIG. 5 shows samples separated by 2 sensor cycles.

DESCRIPTIONS OF THE DRAWINGS

Embodiments of the invention will now be described by way of non-limiting example and with reference to the accompanying figures, in which.

DETAILED DESCRIPTION OF EMBOIDMENST OF THE INVENTION

Figure 6:
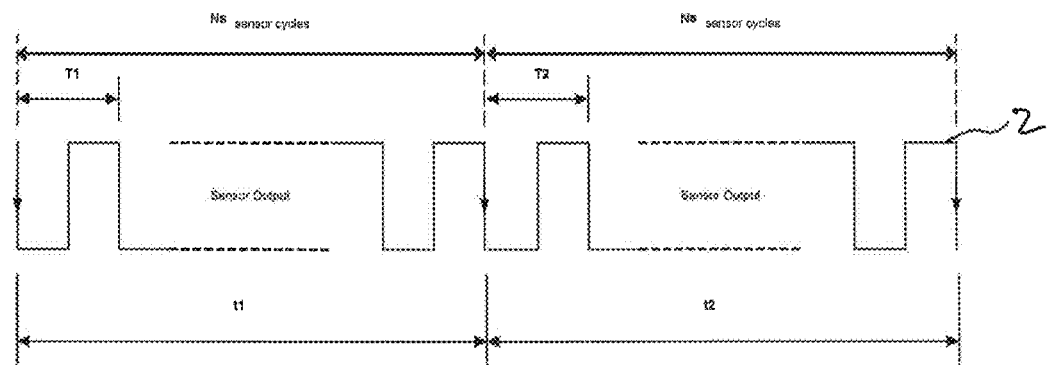
FIG. 6 illustrates the known sampling arrangement of FIGS. 1 and 2 applied to two consecutive measurements.

Embodiments of the subject invention are implemented in routines executed by a data processor or computer. The routines may be embodied in software or hardware, and may be on a removable data carrier Referring to FIG. 6 which shows the known arrangement, the time t is measured between the corresponding (rising or falling) edges of Ns square wave cycles. The average period of one cycle in interval i is hence given by:

$$Ti = ti/Ns \tag{9}$$

If the noise on the measurement of t is E, the noise on one cycle is:

$$Ep = E/Ns \tag{10}$$

Figure 7:
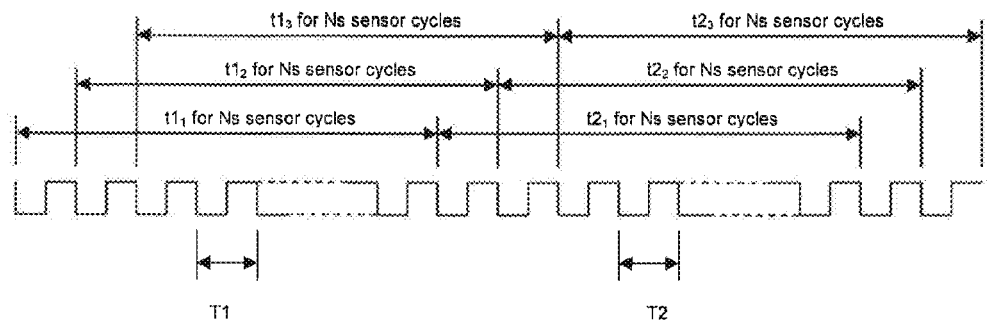
FIG. 7 illustrates the sampling arrangement embodying the invention of FIG. 4 applied to two consecutive measurements.

For the modified sampling method of FIG. 7 embodying the subject invention, a number of overlapping measurements of t, each over Ns sensor cycles, is made as shown in FIG. 7. In the example of FIG. 7 there are 3 overlapping measurements, however there can be any number (n) overlapping time measurements, provided that edges are not shared within a measurement interval.

The average period of a single sensor cycle for interval i is then calculated as follows:

$$Ti = (ti_1 + ti_2 + ti_3)/(3 \times Ns) \tag{11}$$

If there are n overlapping samples the general case is:

$$T_i = \frac{\sum_{a=1}^{n} t_{i_a}}{nN_s} \quad (12)$$

As described above (see equations 7 and 8), if the noise on the measurement of t is E then the noise for the averaged overlapping samples will be:

$$E' = \frac{E}{\sqrt{n}}$$

and the noise on an individual period will be $$Ep = \frac{E}{N_s\sqrt{n}}$$

Figure 5:
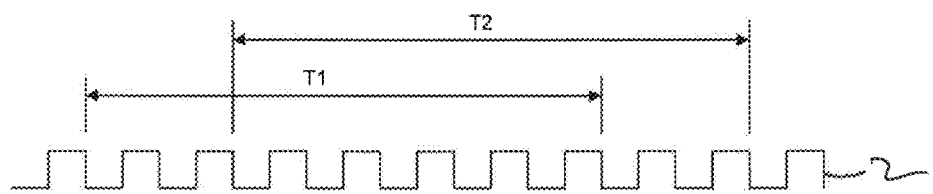
FIG. 5 illustrates an alternative sampling arrangement embodying this invention.

The example discussed above with reference to FIG. 7 shows the samples overlapping by a single sensor cycle. However, it is possible to provide arrangements (see, for example, FIG. 5) in which the samples are offset by more than one sensor cycle. This increases the available time for processing. Such a change does not affect the level of noise reduction but does increase the measurement or response time.

The embodiments of the invention discussed above measure the period between falling edges of the signal. Embodiments could also use rising edges or rising and falling edges. An embodiment using both falling and rising edges at the same time would require more complex signal processing but would allow one to obtain twice as many measurements in the same time.

Figure 8:
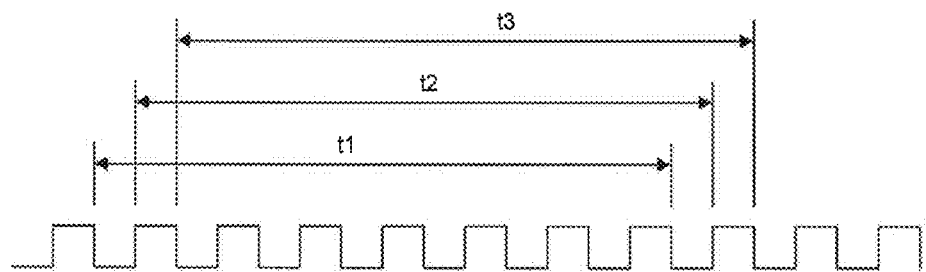
FIG. 8 illustrates a further alternative sampling method embodying the invention, in which rising and falling edges of signal pulses are used.
Figure 9:
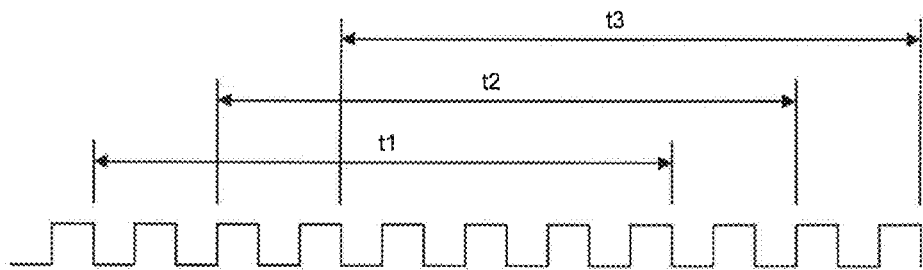
FIG. 9 illustrates a further alternative sampling method embodying the invention and in which rising and falling edges of signal pulses are used.

FIG. 8 illustrates a system in which rising and falling edges are used. The samples t1, t2, and t3 are each offset from each other with the start and finish of each individual time measurement or sample t1, t2, and t3 being taken on both rising or falling edges. The embodiment of FIG. 9 is similar to that of FIG. 8 except that the overlap is increased.

Figure 4:
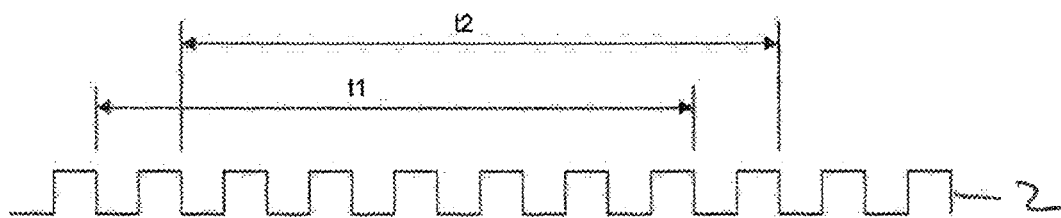
FIG. 4 illustrates a sampling arrangement embodying the invention for determining the output frequency from a vibrating cylinder sensor.
Figure 10:
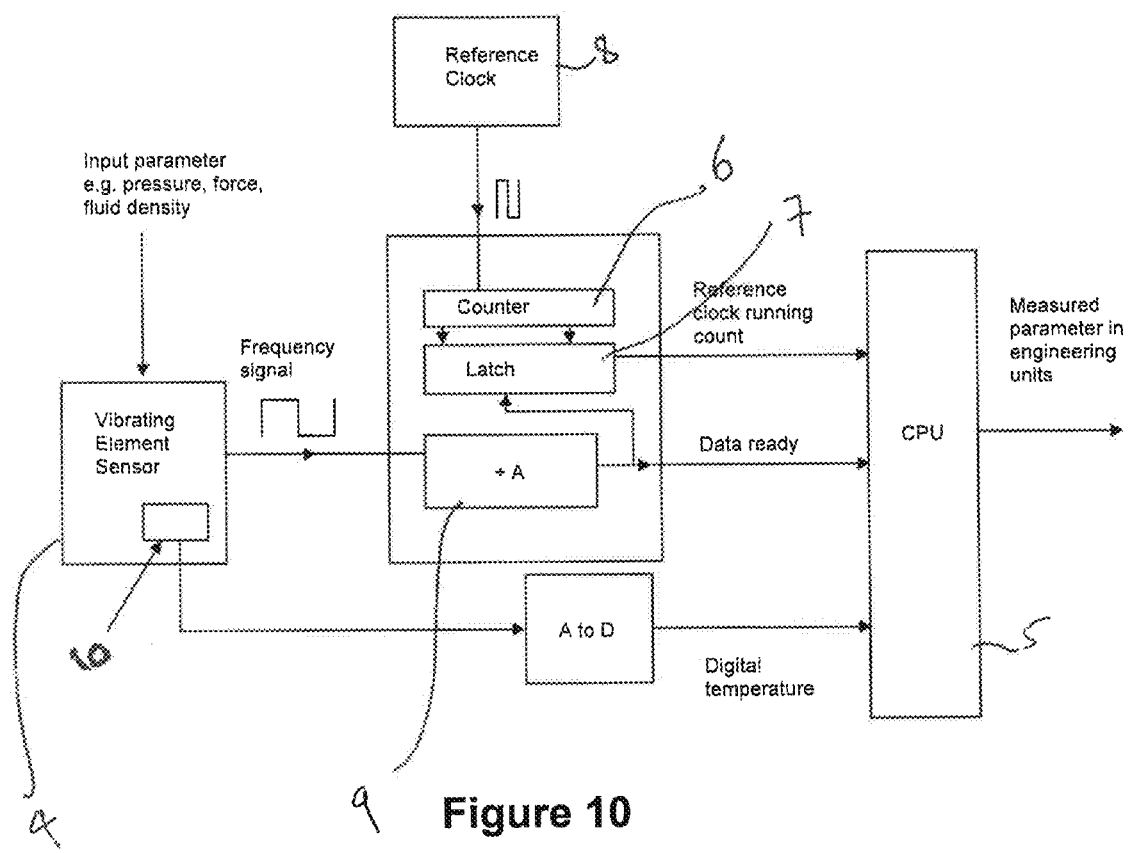
FIG. 10 is a diagram illustrating a system embodying the invention.

FIG. 10 shows an implementation of a vibrating element sensor 4 with processing to output the measured parameter in digital engineering units and apply the new noise reduction technique described above with reference to FIGS. 4, 5 and 7. The vibrating element sensor 4 could be of a type to measure any parameter where the output frequency is related to the input parameter. Examples of such sensors are a pressure sensor (e.g. Weston 7881 pressure sensor), a force sensor, a fluid density sensor (e.g. Weston 7825 fuel densitometer). The sensor may also incorporate a temperature sensor to facilitate correction of measurements for the effects of temperature. The temperature sensor could have a digital output to allow direct interfacing with a CPU (Central Processing Unit) 5 or could be an analogue device with an analogue to digital convertor used to provide a digital input to the CPU.

The period T is measured by measuring the time between two edges at the start and finish of a portion of a pulse train. This is done by using a digital counter 6, a latch 7 and a clock oscillator 8 with a known frequency (see FIG. 10). The running count of the clock 8 is loaded into the latch 7 which is triggered by the start and finish edges of the signal pulse train. The number of clock pulses in the portion of signal is calculated by subtracting the start from the finished latched counts. This subtraction can be performed using a program controlling a computer, or in hardware (i.e. without software) using a suitable arrangement of logic gates (e.g. in a FPGA–Field-Programmable Gate Array), or using a combination of the two.

The frequency output of the sensor 4 is used to latch the output of a free running counter driven by an accurate reference clock 8. When the counter 6 is latched the processor is notified that a reference count is available to be read. A fast CPU may be capable of processing timing data from every sensor cycle, in which case the divider 9 would not be used. However, where timing restrictions apply, a divider 9 could be implemented so that the reference clock is latched every A sensor cycles. The example discussed above with reference to FIG. 5, uses measurements every 2 cycles. The counters and supporting logic could be contained within the CPU 5 itself or implemented externally using an FPGA (Field-Programmable Gate Array), for example.

Figure 1:
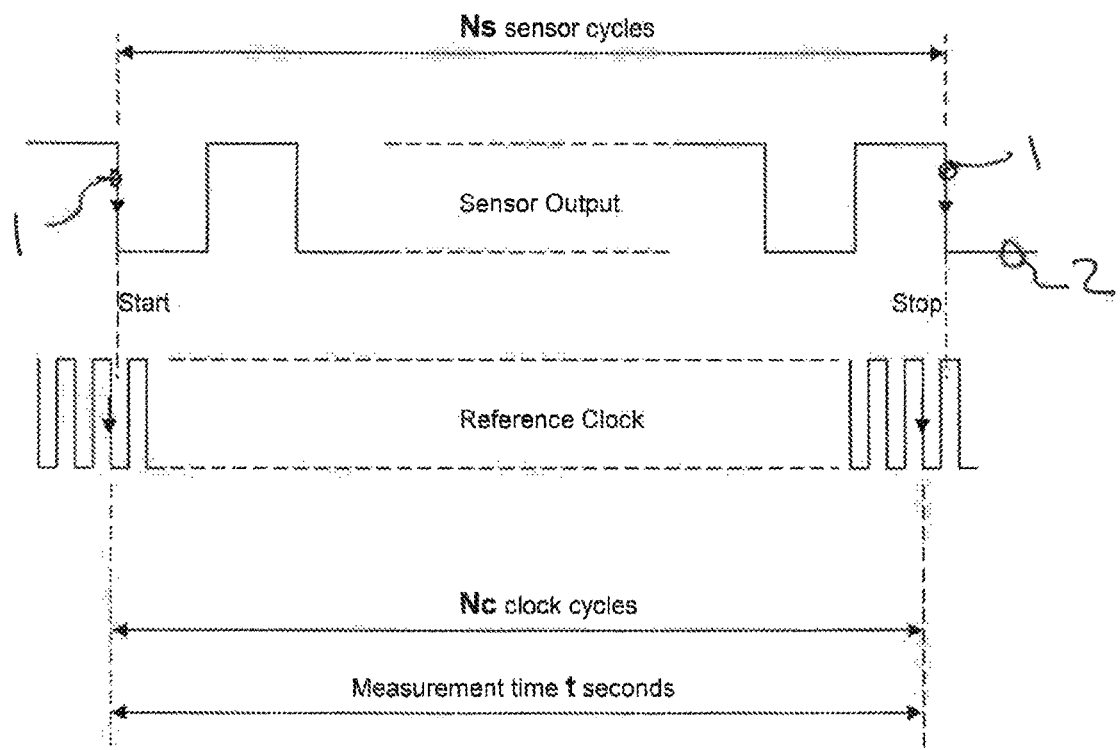
FIG. 1 illustrates a known arrangement for determination of the output frequency from a vibrating cylinder sensor.
Figure 2:
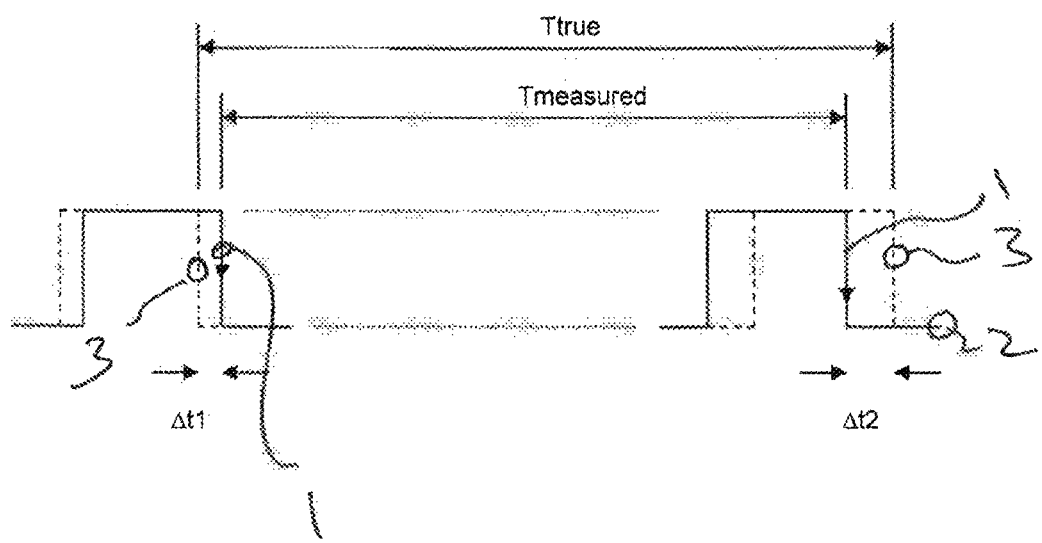
FIG. 2 illustrates the effect of noise on the sensor output signal train.
Figure 3:
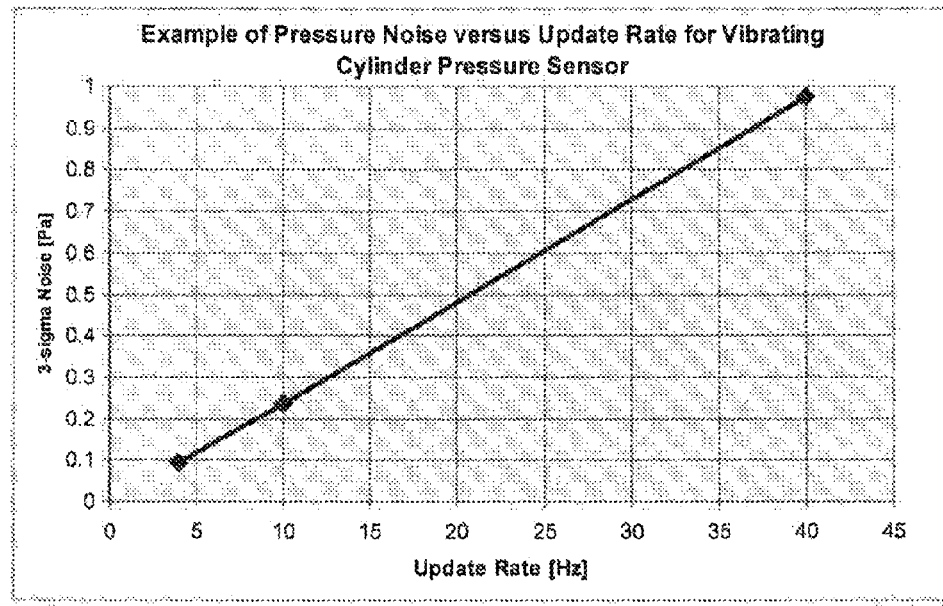
FIG. 3 is a graph showing an example of pressure noise plotted against update rate for a vibrating cylinder pressure sensor.

Software in the CPU 5 is used to calculate the number of reference clock counts (Nc) within each overlapping measurement interval t1, t2, t3 etc (Nc being a means of determining each time interval t1, t2, t3 etc) and to then calculate the average of the overlapping time intervals or periods t1, t2, t3 etc. Each interval contains the same number of sensor cycles Ns. Nc for each interval (tn) is calculated by subtracting the start and finish values of the free running clock. The averaged value of Nc is used to calculate the sensor's output time period as discussed above with reference to FIG. 1 and equation 1. Alternatively these functions could be performed by an FPGA.

The complete transducer, as shown in the block diagram of FIG. 10, includes a temperature sensor 10 which is used to measure the temperature of the vibrating element sensor and hence characterised it for temperature. A calibration equation can thus be derived to calculate the measured value in chosen engineering units and implemented in software run in the CPU 5.

The invention claimed is:

1. A method of determining a frequency of a signal train using a digital counter, a clock oscillator and a latch, the signal train having a series of signal pulses, the counter being driven by the clock and the method including the steps of:
   i) sampling the signal train over a first signal portion and a second signal portion of the signal train, the first and second signal portions having a predetermined number of signal pulses and the second signal portion overlapping with the first signal portion;
   ii) loading clock counts from the digital counter into the latch when triggered by start and finish edges of the first and second signal portions of the signal train;
   iii) subtracting clock counts latched by start edges from clock counts latched by finish edges of the first and second signal portions to obtain periods of the first and second signal portions;
   iv) determining first and second average periods for the first and second signal portions of the signal train; and
   v) determining the average of the determined average periods.

2. A method according to claim 1 including the additional step of sampling a further signal portion and determining a further average period for that further signal portion of the signal train, and wherein the determination of the average of the determined average periods includes the further average period.

3. A method according to claim 1 wherein the first and second portions of the signal train overlap by one signal pulse.

4. A method according to claim 1 wherein the frequency of the series of signal pulses is dependent on an input or measured parameter.

5. A method according to claim 4 for determining the frequency of the output signal train from a vibrating element sensor.

6. A method according to claim 4 for determining the frequency of the output signal train from a Doppler radar system.

7. A system for determining a frequency of a signal train having a series of signal pulses, the system including a digital counter, a clock oscillator and a latch, the clock oscillator being configured to drive the digital counter, the system further including:
   i) means for sampling the signal train over a first signal portion and a second signal portion of the signal train, the first and second signal portions having a predetermined number of signal pulses and the second signal portion overlapping with the first signal portion;
   ii) means for loading clock counts from the digital counter into the latch when triggered by start and finish edges of the first and second signal portions of the signal train;
   iii) means for subtracting clock counts latched by start edges from clock counts latched by finish edges of the first and second signal portions to obtain periods of the first and second signal portions;
   iv) means for determining first and second average periods for the first and second signal portions of the signal train; and
   v) means for determining the average of the determined average periods.

8. A sensor for determining the frequency of vibration of a vibratable element, the sensor producing a signal corresponding to movement of the vibratable element using a digital counter, a clock oscillator and a latch, the signal train having a series of signal pulses, the counter being driven by the clock and, and the sensor having been configured to:
   i) sample the signal train over a first signal portion and a second signal portion of the signal train, the first and second signal portions having a predetermined number of signal pulses and the second signal portion overlapping with the first signal portion;
   ii) loading clock counts from the digital counter into the latch when triggered by start and finish edges of the first and second signal portions of the signal train;
   iii) subtracting clock counts latched by start edges from clock counts latched by finish edges of the first and second signal portions to obtain periods of the first and second signal portions;
   iv) determining first and second average periods for the first and second signal portions of the signal train; and
   v) determine the average of the determined average periods.

9. A method according to claim 1 wherein the first and second portions of the signal train overlap by two signal pulses.

10. A method according to claim 2 wherein the first and second portions of the signal train overlap by two signal pulses.

11. A method according to claim 5 wherein the vibrating element sensor is a pressure sensor, the sensor further including a temperature sensor for correcting measurements for the effects of temperature.

12. A method according to claim 1 wherein the start edge of the first signal portion is a rising edge and the start edge of the second signal portion is a falling edge.

13. A method according to claim 1 including a step of notifying a processor that a count is available to be read when a clock count is latched.

14. A method according to claim 1 including a step of dividing the signal train by X using a divider such that the clock is latched every X signal pulses of the signal train, wherein X is a predetermined number.

15. A method according to claim 1 wherein the subtraction is performed using one or more of:
   a program controlling a computer; and
   a suitable arrangement of logic gates such as an FPGA.

* * * * *